United States Patent [19]

Abrokwah et al.

[11] Patent Number: 5,895,929
[45] Date of Patent: Apr. 20, 1999

[54] LOW SUBTHRESHOLD LEAKAGE CURRENT HFET

[75] Inventors: Jonathan Abrokwah, Tempe; Rodolfo Lucero, Scottsdale; Bruce Bernhardt, Chandler, all of Ariz.

[73] Assignee: Motorola, Inc., Schaumburg, Ill.

[21] Appl. No.: 09/110,976

[22] Filed: Jul. 7, 1998

Related U.S. Application Data

[63] Continuation-in-part of application No. 08/636,050, Apr. 22, 1996.

[51] Int. Cl.[6] .......... H01L 31/0328; H01L 31/0336; H01L 31/072; H01L 31/109
[52] U.S. Cl. .......... 257/20; 257/24; 257/192; 257/194; 257/195
[58] Field of Search .......... 257/192, 194, 257/195, 20, 24

[56] References Cited

U.S. PATENT DOCUMENTS

| | | | |
|---|---|---|---|
| 4,774,205 | 9/1988 | Choi et al. | 438/23 |
| 5,084,743 | 1/1992 | Mishra et al. | 257/487 |
| 5,196,358 | 3/1993 | Boos | 438/186 |
| 5,243,207 | 9/1993 | Plumton et al. | 257/192 |
| 5,266,506 | 11/1993 | Green, Jr. | 438/172 |
| 5,313,083 | 5/1994 | Schindler | 257/280 |
| 5,646,069 | 7/1997 | Jelloian et al. | 438/605 |

*Primary Examiner*—William Mintel
*Attorney, Agent, or Firm*—Eugene A. Parsons; William E. Koch

[57] ABSTRACT

A low subthreshold leakage current, p-channel HFET including a GaAs supporting substrate with a first GaAs buffer layer and a first $Al_{0.75}Ga_{0.25}As$ diffusion barrier layer formed thereon and a low temperature grown layer, including one of GaAs and AlGaAs, grown at 200° C. on the first diffusion barrier layer. A second $Al_{0.75}Ga_{0.25}As$ diffusion barrier layer is positioned on the low temperature grown layer and a second GaAs buffer layer is grown on the second diffusion barrier layer. A p-channel HFET is formed on the second buffer layer.

19 Claims, 1 Drawing Sheet

LOW SUBTHRESHOLD LEAKAGE CURRENT HFET

This application is a cont-in-part of Ser. No. 08/636,050 filed on Apr. 22, 1996.

FIELD OF THE INVENTION

The present invention pertains to heterostructure field effect transistors and more specifically to heterostructure field effect transistors with low subthreshold leakage current.

BACKGROUND OF THE INVENTION

Field effect transistors (FETs) are used to a great extent in various logic and control circuits because of their low power requirements. As is known, many logic and control circuits use complementary devices to further reduce the power consumed in the circuits. Because of this extensive use, there is a need to make FETs smaller so that larger numbers of them can be incorporated into integrated circuits and the like. Also, by making the FETs smaller, especially with shorter gates, the operating frequency can be much higher and the devices can be used in high speed digital circuits and the like. Some of the smallest FETs are heterostructure FETs (HFETs), including heterostructure insulated gate field effect transistors (HIGFETs).

Prior art HFETs and especially p-channel HFETs cannot practically be made with very short gate lengths due to severe short channel effects such as high output conductance and subthreshold currents. Generally, prior art HFETs are constructed with a buffer layer on the substrate and active device channel. Such buffer layers grown by molecular beam epitaxy process are p-type. For p-channel devices this is one of the key problems that prevents the successful fabrication of prior art submicron devices. As gate dimensions are reduced in these devices, from 1 µm to lower levels (e.g. 0.5 µm), the subthreshold leakage currents increase almost exponentially from near nano-amperes to several hundred nano-amperes, or in some cases microamperes when the gate length is at 0.5 µm. Subthreshold slopes also increase substantially to several hundred millivolts per decade, and the devices do not pinch-off at all. Also, noise margins are severely degraded. Thus, these prior art devices become useless for complementary logic circuits as they are made smaller.

Accordingly, it would be advantageous to provide HFETs which could be fabricated in submicron ranges with improved subthreshold leakage currents.

It is a purpose of the present invention to provide a new and improved HFET and method of fabrication.

It is another purpose of the present invention to provide a new and improved HFET which can be manufactured in submicron ranges with substantially reduced subthreshold leakage currents.

It is still another purpose of the present invention to provide a new and improved p-channel HFET which can be manufactured with gate lengths under 0.5 µm and subthreshold leakage currents in the nanoamperes.

SUMMARY OF THE INVENTION

The above problems and others are at least partially solved and the above purposes and others are realized in a low subthreshold leakage current heterostructure field effect transistor including a substrate structure. The substrate structure includes a supporting substrate of material in a III-V material system with a first buffer layer and a first diffusion barrier formed thereon, a low temperature grown layer of material in the III-V material system positioned on the first diffusion barrier, a second barrier layer in the III-V material system positioned on the low temperature grown layer of material, and a second buffer layer in the III-V material system positioned on the second barrier layer. A heterostructure field effect transistor (HFET) is formed on the second buffer layer. The low temperature grown layer of material in the substrate structure with buffers and barriers on each side prevents carriers from traveling through the substrate structure between source and drain terminals of the HFET during OFF (subthreshold) conditions.

The above problems and others are at least partially solved and the above purposes and others are further realized in a method of fabricating a low subthreshold leakage current heterostructure field effect transistor including the steps of forming a substrate structure by providing a supporting substrate of material in a III-V material system, growing a first barrier layer of material in the same III-V material system on the supporting substrate, growing a first buffer layer of material in the same III-V material system on the first barrier layer, growing a low temperature layer of material in the same III-V material system on the first buffer layer at a temperature of approximately 200° C., growing a second barrier layer of material in the same III-V material system on the low temperature layer of material, and growing a second buffer layer of material in the same III-V material system on the barrier layer. A heterostructure field effect transistor is then formed on the second buffer layer.

BRIEF DESCRIPTION OF THE DRAWINGS

Referring to the drawings.

DESCRIPTION OF THE PREFERRED EMBODIMENT

Figure 1:
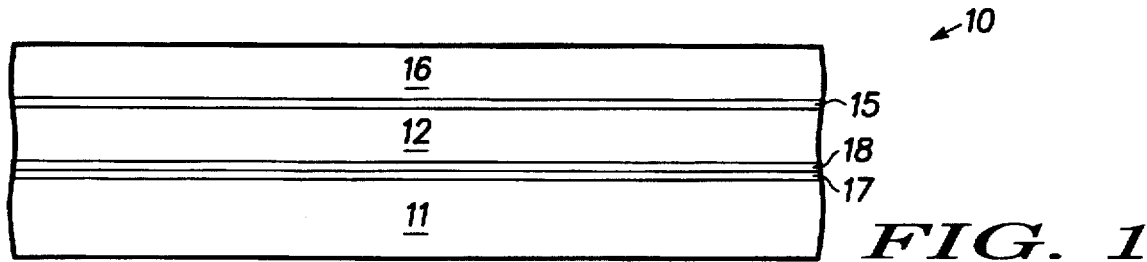
FIGS. 1 through 4 are simplified cross-sectional views illustrating various stages in the fabrication of an HFET in accordance with the present invention.

Turning now to the drawings, FIGS. 1 through 4 are simplified cross-sectional views illustrating various stages in the fabrication of an HFET in accordance with the present invention. Referring specifically to FIG. 1, a substrate structure 10 is illustrated including a supporting substrate 11 and several additional layers of material formed on supporting substrate 11. It should be understood that substrate structure 10 is utilized herein for illustrative purposes and additional or fewer layers might be included therein depending upon the application and specific material utilized. Also, while a gallium arsenide (GaAs) supporting substrate 11 is utilized and a GaAs material system is disclosed for purposes of explanation, it should be understood that other III-V material systems might be utilized for specific applications. Prior to proceeding with the present process, the surface of supporting substrate 11 is pre-treated by ozone cleaning to reduce the carbon levels to less than $10^{12}$ atoms per $cm^2$.

A buffer layer 17, which in this specific example is undoped GaAs, is grown at approximately 600° C. on supporting substrate 11 to a thickness in a range of approximately 500 Å to 1500 Å. A thin diffusion barrier layer 18, which in this embodiment is undoped $Al_xGa_{1-x}As$, is grown at 600° C. on layer 17. In this example in which the GaAs material system is used, diffusion barrier layer 18 is a material of high mole fraction $Al_xGa_{1-x}As$ (e.g., x=75%). Also, diffusion barrier layer 18 is less than approximately 1000 Å thick. Layer 18 is provided to prevent any excess arsenic ions (As) from diffusing towards the direction of supporting substrate 11 and into the stoichiometric, undoped buffer layer 17.

A layer 12 of substrate structure 10 is formed on diffusion barrier layer 18 and is formed of a low temperature grown (LTG) gallium arsenide (GaAs) or aluminum gallium arsenide (AlGaAs). In a preferred embodiment, if AlGaAs is used, the aluminum is not in excess of 75%. Layer 12 is grown epitaxially at a temperature of approximately 200° C. and preferably in a range of 200° C. to 300° C., which results in excess arsenic atoms in the material. Specifically, the temperature is selected so the lattice-mismatch between the LTG gallium arsenide and the GaAs substrate is approximately 1200 ppm. The growth of layer 12 continues until the thickness is greater than approximately 1000 Å and preferably in a range of approximately 1000 Å to 6000 Å. For reasons that will be explained presently, layer 12 contains additional As (arsenic ions), generally greater than 1% and preferably in a range of 1% to 2%. At some convenient point during the fabrication procedure, the structure is annealed at a temperature of approximately 600° C. to realize a high resistivity low temperature layer of material.

As mentioned above, the low temperature GaAs or AlGaAs of layer 12 contains additional As ions which, upon heating to a temperature of approximately 600° C., results in a high density of As precipitates and mid-gap traps that essentially pin the Fermi-level at mid-gap in the material of layer 12, resulting in high resistivity. The lifetime of carriers (holes in p-channel material) in the low temperature grown material is so low (approximately fsec range) that practically most injected carriers are trapped and removed from conduction. Thus hole injection current, for example, is significantly suppressed. It will be understood that when a different III-V material system is utilized different ions may be incorporated into layer 12 to form the carrier trapping precipitates and mid-gap traps.

A thin diffusion barrier layer 15, which in this embodiment is undoped $Al_xGa_{1-x}As$, is grown at 600° C. on layer 12. In this example in which the GaAs material system is used, diffusion barrier layer 15 is a material of high mole fraction $Al_xGa_{1-x}As$ (e.g., x=75%). Also, diffusion barrier layer 15 is less than approximately 1000 Å thick. A buffer layer 16, which in this specific example is undoped GaAs, is grown at approximately 600° C. on barrier layer 15 to a thickness in a range of approximately 500 Å to 1500 Å. Layer 15 is provided to prevent any excess arsenic ions (As) from diffusing into the stoichiometric, undoped buffer layer 16. The thicknesses of the various layers in supporting substrate structure 10 are optimized to ensure device transconductance and other DC parameters are not degraded.

Figure 2:
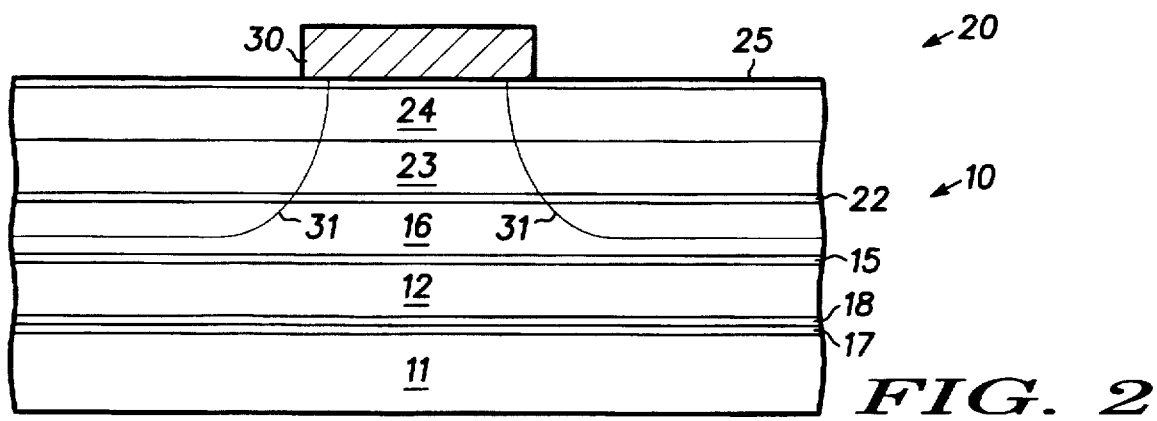

A heterostructure field effect transistor, which in this specific example is a p-channel heterostructure insulated gate field effect transistor (HIGFET), is formed on buffer layer 16 of supporting substrate 10 generally as follows. Referring to FIG. 2, a thin layer 22 of material with Si delta doping is grown on buffer layer 16 and a channel layer 23 of InGaAs is grown on layer 22. A layer 24 of $Al_{0.75}Ga_{0.75}As$ is grown on layer 23 and a thin GaAs cap layer 25 is grown on layer 24 to prevent oxidation of the $Al_{0.75}Ga_{0.25}As$. A metal gate contact 30 of refractory metal, such as TiWN or WSi, is formed on GaAs cap layer 25 by sputtering, photoresist definition and reactive ion etch.

Figure 3:
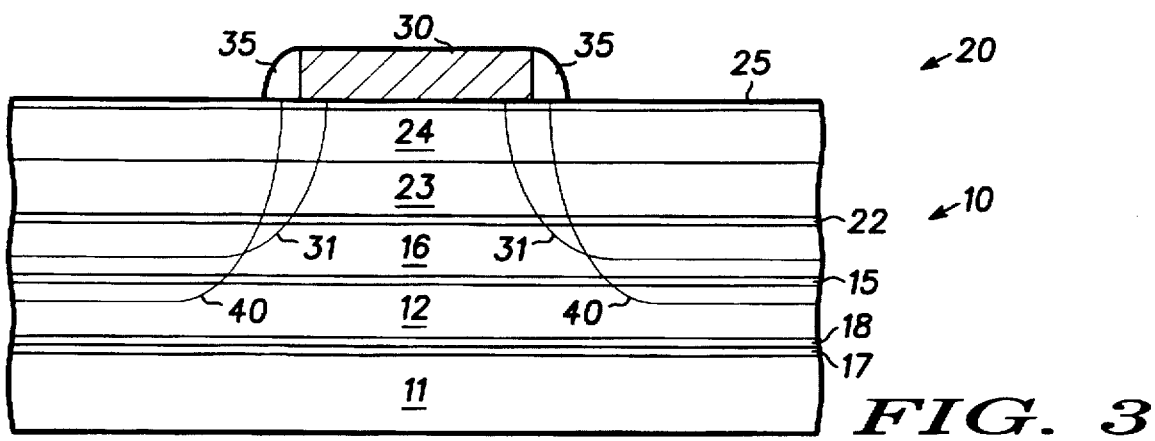

Using gate contact 30 and sidewall technology for masking, self-aligned p-type implants are provided to form source and drain regions. Still referring to FIG. 2, gate contact 30 is used as an implant mask to form a lightly doped (p⁻) region 31. Sidewall 35 is formed at the edge of gate contact 30, as illustrated in FIG. 3, using any of the standard methods, such as conformally depositing a dielectric layer of material and etching until only a sidewall remains. The combination of sidewall 35 and gate contact 30 is then used as a mask for a P⁺ contact implant 40. Generally, the p⁻ resistivity is 1000–2000 ohms/sq and the P⁺ resistivity is 200 ohms/sq. Implant activation is 700° C. to 800° C., minimizing out diffusion of impurities. In this specific example, the implants are co-implants of F⁺ and Be.

Figure 4:
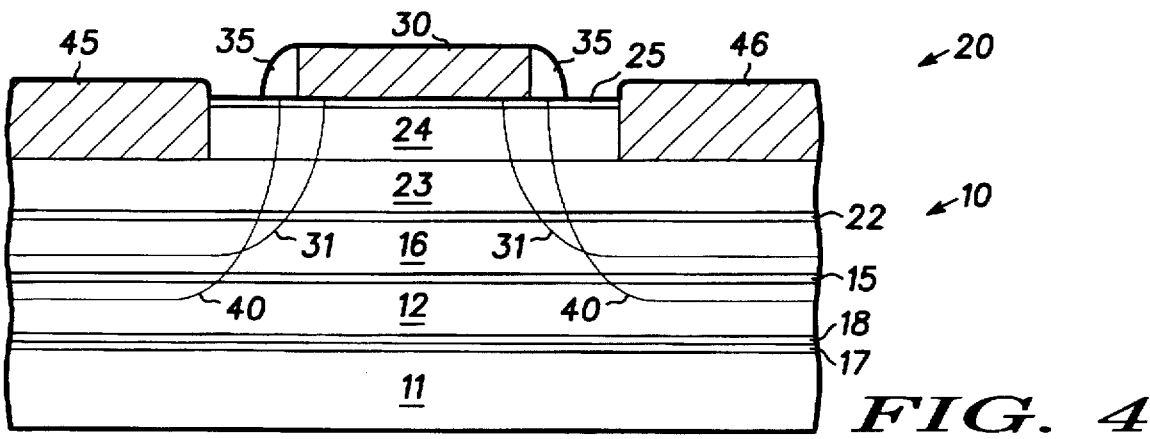

Referring specifically to FIG. 4, GaAs cap layer 25 and layer 24 are etched to form source and drain contact areas. Metallization is then performed by any of the well known techniques such as evaporation and lift-off, to form a source contact 45 and a drain contact 46. While a specific heterostructure field effect transistor is illustrated and described, it will be understood that other types of HFETs and other semiconductor devices can be fabricated using the described process.

Thus, substrate structure 10, and specifically low temperature layer 12 and diffusion barrier layers 15 and 18, screen substrate/epi layer interface defects and prevent injected carriers from traveling through substrate structure 10 between the source and drain. Low temperature layer 12 has a relatively high resistivity to carriers traveling therethrough. Also, low temperature layer 12 has a high density of traps with very short lifetime, so that injected carriers (holes in this example) from the source are trapped in low temperature layer 12 and prevented from traveling to the drain. Therefore, a new and improved HFET and method of fabrication is disclosed. The new and improved HFET can be manufactured in submicron ranges with substantially reduced subthreshold leakage currents. Further, a new and improved p-channel HFET which can be manufactured with gate lengths under 0.5 μm and subthreshold leakage currents in the nanoamperes is disclosed.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A low subthreshold leakage current heterostructure field effect transistor comprising:

a substrate structure including a supporting substrate of material in a III-V material system, a first buffer layer in the III-V material system positioned on the supporting substrate, a first diffusion barrier layer in the III-V material system positioned on the first buffer layer, a low temperature grown layer of material in the III-V material system positioned on the first diffusion barrier layer, a second diffusion barrier layer in the III-V material system positioned on the low temperature grown layer of material, and a second buffer layer in the III-V material system positioned on the second diffusion barrier layer; and a heterostructure field effect transistor formed on the second buffer layer.

2. A low subthreshold leakage current heterostructure field effect transistor as claimed in claim 1 wherein the low temperature grown layer of material includes ions of a material that produce carrier trapping precipitates and mid-gap traps.

3. A low subthreshold leakage current heterostructure field effect transistor as claimed in claim 1 wherein the supporting substrate includes GaAs with an ozone pre-cleaned surface.

4. A low subthreshold leakage current heterostructure field effect transistor as claimed in claim 3 wherein the low temperature grown layer of material includes GaAs and the first and second diffusion barrier layers include AlGaAs.

5. A low subthreshold leakage current heterostructure field effect transistor as claimed in claim 4 wherein the low temperature grown layer of material includes excess arsenic such that a lattice mismatch of the low temperature GaAs prior to any annealing with respect to the supporting substrate is about 1200 ppm.

6. A low subthreshold leakage current heterostructure field effect transistor as claimed in claim 4 wherein the low temperature grown layer of material has a thickness in a range of 1000 Å to 6000 Å.

7. A low subthreshold leakage current heterostructure field effect transistor as claimed in claim 4 wherein the low temperature grown layer of material has a resistivity in excess of $10^7$ ohms per square.

8. A low subthreshold leakage current heterostructure field effect transistor as claimed in claim 4 wherein the low temperature grown layer of material includes GaAs grown at a temperature of approximately 200° C.

9. A low subthreshold leakage current heterostructure field effect transistor as claimed in claim 4 wherein the low temperature grown layer of material includes $Al_xGa_{1-x}As$ with an Al composition up to 75%.

10. A low subthreshold leakage current heterostructure field effect transistor as claimed in claim 3 wherein the first and second diffusion barrier layers of material include $Al_{0.75}Ga_{0.25}As$ grown at a temperature of approximately 600° C.

11. A low subthreshold leakage current heterostructure field effect transistor as claimed in claim 3 wherein the buffer layer of material includes undoped GaAs.

12. A low subthreshold leakage current heterostructure field effect transistor as claimed in claim 11 wherein the buffer layer of material has a thickness in a range of 500 Å to 1500 Å.

13. A low subthreshold leakage current heterostructure field effect transistor as claimed in claim 1 wherein the heterostructure field effect transistor includes a gate with a length less than 0.5 μm.

14. A low subthreshold leakage current heterostructure field effect transistor as claimed in claim 1 wherein the heterostructure field effect transistor includes a p-channel field effect transistor.

15. A low subthreshold leakage current, p-channel heterostructure field effect transistor comprising:
    a substrate structure including
        a supporting substrate of material in a GaAs material system,
        a first GaAs buffer layer grown on the supporting substrate;
        a first barrier layer including $Al_{0.75}Ga_{0.25}As$ grown at a temperature of approximately 600° C. on the first buffer layer,
        a low temperature grown layer, including one of GaAs and AlGaAs, grown at 200° C. on the first barrier layer,
        a second barrier layer including $Al_{0.75}Ga_{0.25}As$ grown at a temperature of approximately 600° C. on the low temperature grown layer, and
        a second GaAs buffer layer grown on the second barrier layer; and
    a p-channel heterostructure field effect transistor formed on the buffer layer.

16. A low subthreshold leakage current heterostructure field effect transistor as claimed in claim 15 wherein the low temperature grown layer of material has a thickness in a range of 1000 Å to 6000 Å.

17. A low subthreshold leakage current heterostructure field effect transistor as claimed in claim 15 wherein the low temperature grown layer of material has a resistivity in excess of $10^7$ ohms per square.

18. A low subthreshold leakage current heterostructure field effect transistor as claimed in claim 15 wherein the first and second buffer layers of material each have a thickness in a range of 500 Å to 1500 Å.

19. A low subthreshold leakage current heterostructure field effect transistor as claimed in claim 15 wherein the heterostructure field effect transistor includes a gate with a length less than 0.5 μm.

* * * * *